(12) United States Patent
Harada et al.

(10) Patent No.: US 7,951,623 B2
(45) Date of Patent: May 31, 2011

(54) PROCESS FOR PRODUCING OPTICAL SEMICONDUCTOR DEVICE

(75) Inventors: Noriaki Harada, Ibaraki (JP); Ryuuichi Kimura, Ibaraki (JP); Kouji Akazawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 295 days.

(21) Appl. No.: 12/202,456

(22) Filed: Sep. 2, 2008

(65) Prior Publication Data

US 2009/0061549 A1    Mar. 5, 2009

(30) Foreign Application Priority Data

Sep. 3, 2007  (JP) ................................. 2007-228002

(51) Int. Cl.
    *H01L 21/00* (2006.01)
(52) U.S. Cl. ...................... 438/27; 257/98; 257/E21.502
(58) Field of Classification Search .................... 438/27; 257/98, 294, E21.502, E21.54, E21.705
    See application file for complete search history.

(56) References Cited

U.S. PATENT DOCUMENTS

| | | | |
|---|---|---|---|
| 7,372,079 B2 * | 5/2008 | Kuiseko et al. | 257/98 |
| 7,452,737 B2 * | 11/2008 | Basin et al. | 438/27 |
| 7,781,794 B2 * | 8/2010 | Suehiro et al. | 257/100 |
| 2005/0202598 A1 * | 9/2005 | Suehiro et al. | 438/118 |
| 2008/0079014 A1 * | 4/2008 | Ng et al. | 257/98 |

FOREIGN PATENT DOCUMENTS

| JP | 2005-294733 A | 10/2005 |
|---|---|---|
| JP | 2006-140362 A | 6/2006 |

* cited by examiner

*Primary Examiner* — W. David Coleman
(74) *Attorney, Agent, or Firm* — Sughrue Mion, PLLC

(57) ABSTRACT

The present invention relates to a process for producing an optical semiconductor device, the process including: disposing a sheet for optical-semiconductor-element encapsulation including a resin sheet A and a plurality of resin layers B discontinuously embedded in the resin sheet A and a plurality of optical semiconductor elements mounted on a substrate in such a way that each of the plurality of optical semiconductor elements faces either one of the plurality of resin layers B; and followed by embedding each of the plurality of optical semiconductor elements in either one of the plurality of resin layers B. According to the process of the invention, optical semiconductor elements can be embedded at once. As a result, an optical semiconductor device which is excellent in LED element protection and durability can be easily obtained. Consequently, the optical semiconductor device obtained can have a prolonged life.

8 Claims, 1 Drawing Sheet

PROCESS FOR PRODUCING OPTICAL SEMICONDUCTOR DEVICE

FIELD OF THE INVENTION

The present invention relates to a process for producing an optical semiconductor device. More particularly, the invention relates to a process for optical-semiconductor-device production including a step of encapsulating light-emitting elements such as light-emitting diodes or semiconductor lasers with a sheet for optical-semiconductor-element encapsulation at once; as well as the sheet for optical-semiconductor-element encapsulation which is used in the process.

BACKGROUND OF THE INVENTION

Light-emitting devices having optical semiconductors such as light-emitting diodes (LEDs) are spreading in recent years as substitutes for incandescent lamps or fluorescent lamps. Although LEDs are inferior to conventional illuminators such as fluorescent lamps in luminance per element, the size of each element is up to 1 mm at the most. Therefore, a light-emitting device having an LED mounted thereon is usually produced by disposing two or more LED elements on a substrate.

In general, a method for producing a light-emitting device having an LED includes mounting LED elements on a substrate, followed by encapsulating the elements. As a technique for LED element encapsulation, a method in which the elements are embedded in an organic resin by injection molding or potting is known. However, this technique has drawbacks, for example, that it necessitates the trouble of dropping a given amount of a liquid resin onto the individual elements. Therefore, there is a desire for an encapsulation technique which can be practiced more easily.

JP-A-2005-294733 discloses a sheet for encapsulation which has a multilayer structure composed of resin layers differing in refractive index and which not only is effective in easily conducting resin encapsulation but also produces an effect that the optical semiconductor device obtained can retain a high efficiency of light takeout. JP-A-2006-140362 discloses a sheet for encapsulation which has a multilayer structure composed of resin layers differing in refractive index and a light-diffusing layer interposed between the resin layers from the standpoint of diffusing the directional properties of light.

SUMMARY OF THE INVENTION

With the recent trend toward power enhancement in LEDs, a problem concerning device life, i.e., encapsulant resin deterioration, arises. As a result of an increased LED power for a higher luminance, the quantity of the light and heat emitted by the LEDs increase. Therefore, the deterioration of the encapsulant resin accelerates, resulting in a shortened device life.

An object of the invention is to provide a process for easily producing an optical semiconductor device excellent in LED element protection and durability using a sheet for optical-semiconductor-element encapsulation with which optical semiconductor elements can be encapsulated in a resin at once. Another object of the invention is to provide a sheet for optical-semiconductor-element encapsulation which is for use in the process.

The present inventors made investigations in order to overcome that problem. As a result, they have found that when a sheet for optical-semiconductor-element encapsulation containing a resin sheet which is excellent in the property of protecting LED elements and adhesiveness and a plurality of resin layers which are discontinuously embedded in the resin sheet and is excellent in heat resistance and light resistance is used, then optical semiconductor elements can be embedded in the respective resin layers at once and an optical semiconductor device which is excellent in LED element protection and durability can be easily produced. The invention has been thus completed.

Namely, the present invention relates to the following items (1) to (5).

(1) A process for producing an optical semiconductor device, the process including:

disposing a sheet for optical-semiconductor-element encapsulation including a resin sheet A and a plurality of resin layers B discontinuously embedded in the resin sheet A and a plurality of optical semiconductor elements mounted on a substrate in such a way that each of the plurality of optical semiconductor elements faces either one of the plurality of resin layers B; and followed by embedding each of the plurality of optical semiconductor elements in either one of the plurality of resin layers B.

(2) The process according to (1), in which the plurality of resin layers B include a silicone resin or a heterosiloxane.

(3) The process according to (2), in which the silicone resin is a crosslinked silicone.

(4) The process according to any one of (1) to (3), in which the resin sheet A includes an epoxy resin or an acrylic resin.

(5) A sheet for optical-semiconductor-element encapsulation which is used in the process according to any one of (1) to (4).

According to the process of the invention, optical semiconductor elements can be embedded at once. As a result, an optical semiconductor device which is excellent in LED element protection and durability can be easily obtained. Consequently, the optical semiconductor device obtained can have a prolonged life.

Figure 1:
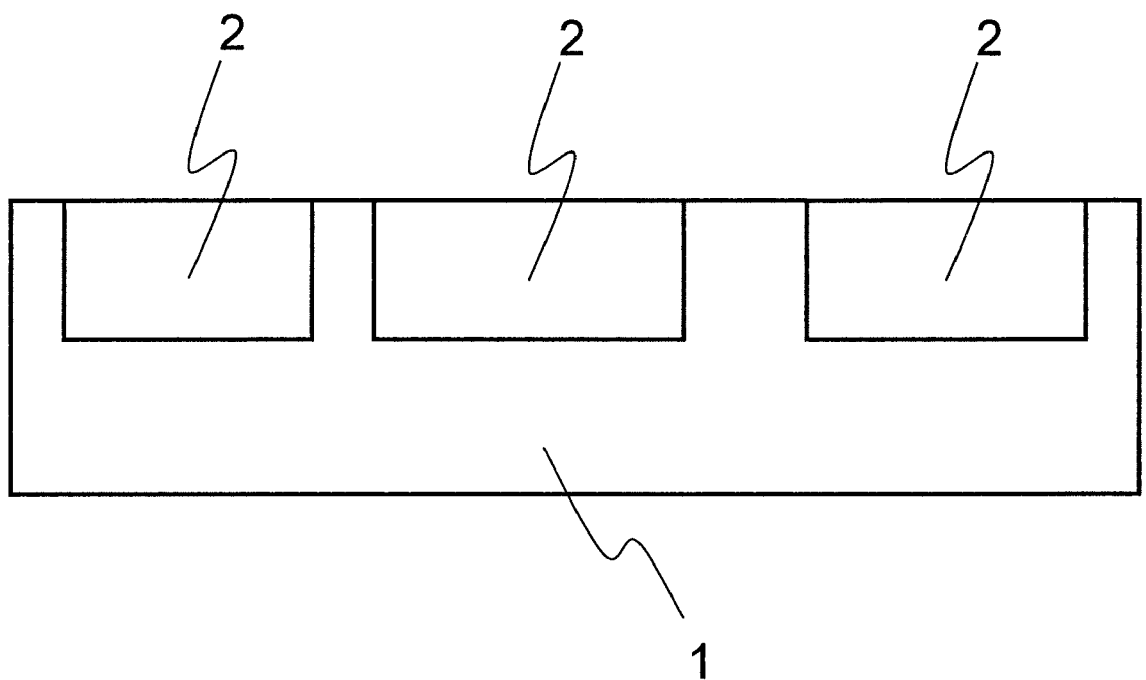
FIG. 1 is a view illustrating one embodiment of the sheet for optical-semiconductor-element encapsulation of the invention; it is a cross-sectional view including a plurality of resin layers B cut in a direction perpendicular to the sheet plane in each of the sheets used in Examples 1 to 5.

DESCRIPTION OF THE REFERENCE NUMERALS AND SIGNS 1 resin sheet A
2 resin layer B

DETAILED DESCRIPTION OF THE INVENTION

In the process for producing an optical semiconductor device of the invention, a sheet for optical-semiconductor-element encapsulation is used to encapsulate optical semiconductor elements (hereinafter referred to as LED elements), and the sheet contains a resin sheet A which is excellent in strength and adhesiveness and a plurality of resin layers B which are excellent in heat resistance and light resistance and are discontinuously embedded in the resin sheet A.

Conventional sheets for optical-semiconductor-element encapsulation are constituted by superposing resin layers retaining various functions required of encapsulation sheets, such as light resistance, light-diffusing properties, and heat resistance. Examples of the resins constituting each layer of such an encapsulation sheet include epoxy resins and silicone resins. However, the layer including an epoxy resin is insufficient in durability such as heat resistance. On the other hand, since the layer including a silicone resin has poor adhesion to substrates and poor resistance to external impact, the layer including a silicone resin is inferior in the property of protecting LED elements. In such a sheet composed of superposed resin layers, an outermost resin layer which contacts with LED elements simultaneously has areas which are in contact with the LED elements (i.e., areas which are required to have durability) and areas which are in contact with those parts of the substrate where no LED elements are present (i.e., areas which are required to have adhesiveness). Because of this, in the case where the outermost resin layer is made only of that resin, it is difficult to satisfy both of durability and the property of protecting LED elements.

In the sheet for optical-semiconductor-element encapsulation of the invention, the function of imparting satisfactory adhesiveness and satisfactory strength is allotted to the resin sheet A, while the function of imparting satisfactory heat resistance and satisfactory light resistance is allotted to the resin layers B. Therefore, both of the property of protecting LED elements and durability can be satisfied.

Namely, the sheet for encapsulation of the invention contains a resin sheet A which is excellent in adhesiveness and strength and resin layers B which is excellent in heat resistance and light resistance and are embedded discontinuously in the resin sheet A in the positions corresponding to the positions where LED elements are present so that the resin layers B face the LED elements. Due to this constitution, the respective LED elements are embedded in the respective resin layers B, and the resin sheet A contacts with the substrate where no LED elements are present. Consequently, excellent adhesiveness can be obtained, and it is also possible to satisfy both of durability and the property of protecting LED elements. The term "discontinuously" as used in this specification means the state in which the respective resin layers B corresponding to the respective LED elements are present independently of one another. The term "property of protecting LED elements" means the ability to protect against external impact, i.e., properties including adhesion strength against impact imposed from a shear direction and strength against impact imposed from a vertical direction. The term "durability" means properties including heat resistance and light resistance.

One LED element or a plurality of LED elements may be embedded in the respective resin layers B. Further, the number of the LED element(s) embedded in the respective resin layers B may be the same or different.

The resin constituting the resin sheet A is not particularly limited so long as it is a resin which is conventionally used in sheets for optical-semiconductor-element encapsulation and has strength for protecting LED elements against external forces and adhesiveness to substrates. With respect to durability such as light resistance and heat resistance, the resin constituting the resin sheet A is not particularly limited because the resin layers B, in which LED elements are to be directly embedded, possess that function.

Examples of the resin constituting the resin sheet A include polyethersulfones, polyimides, aromatic polyamides, polycarbodiimides, epoxy resins, triacetyl cellulose, and acrylic resins. Of these, epoxy resins and acrylic resins are preferred from the standpoints of adhesiveness and strength. Such resins to be used may be commercial ones or may be ones produced separately.

Examples of the epoxy resins include bisphenol types such as the bisphenol A and bisphenol F types, novolac type, nitrogen-containing ring type, alicyclic type, aromatic type, and modifications thereof. These may be used alone or in combination of thereof. Of these, the bisphenol A type and the alicyclic type are preferred, from the standpoint of transparency.

The epoxy equivalent of such an epoxy resin is preferably 500 to 10,000, more preferably 2,000 to 5,000. When two or more epoxy resins are used, these epoxy resins each may have an epoxy equivalent outside the range shown above. It is desirable in this case that these epoxy resins have a weight-average epoxy equivalent within the above-mentioned range.

A hardener and a hardening accelerator may be used in curing the epoxy resin.

Examples of the hardener include: acid anhydride hardeners such as phthalic anhydride, tetrahydrophthalic anhydride, hexahydrophthalic anhydride, and 4-methylhexahydrophthalic anhydride; amine hardeners such as diethylenetriamine, triethylenetetramine, and diethylamine; polyamide hardeners; and phenol hardeners. These may be used alone or in combination thereof.

The content of the hardener can be suitably determined according to the kind of the hardener, epoxy equivalent of the epoxy resin and the like. However, from the standpoint of enabling a formed sheet to have sufficient strength, the content of the hardener in the case of, e.g., an acid anhydride hardener is preferably 0.8 to 1.2 equivalents, more preferably 0.9 to 1.1 equivalents based on 1 equivalent of the epoxy groups of the epoxy resin.

Examples of the hardening accelerator include imidazole compounds and phosphorus compounds. These may be used alone or in combination thereof.

The content of the hardening accelerator can be suitably determined according to the effect of acceleration, etc. However, from the standpoint of curing the resin in a short time period during forming, the content of the hardening accelerator is preferably 0.5 to 5 parts by weight, more preferably 1 to 3 parts by weight based on 100 parts by weight of the epoxy resin.

In addition to the above-mentioned resin, additives such as an antioxidant, modifier, surfactant, dye, pigment, discoloration inhibitor, and ultraviolet absorber may be incorporated as raw materials into the resin sheet A.

The resin sheet A is obtained, for example, by dissolving raw materials including the resin in an organic solvent such as toluene, cyclohexanone, or methyl ethyl ketone preferably in such an amount as to result in a concentration of 20 to 50% by weight to prepare a resin solution; applying the solution, for example, on a release sheet such as polyester film having a silicone-treated surface by a technique such as casting, spin coating, or roll coating to form a film of the solution in an appropriate thickness; and then drying the solution film at such a temperature that solvent removal is possible without causing a curing reaction. The temperature at which the resin solution film is dried cannot be unconditionally determined because it varies depending on the kinds of the resin and solvent. However, the temperature is preferably 80 to 150° C., more preferably 90 to 140° C., even more preferably 100 to 130° C. The thickness of the resin sheet obtained through drying with heating is preferably 100 to 1,000 μm, more preferably 100 to 500 μm, from the standpoint of whitening.

Incidentally, two or more, preferably two to four resin sheets which are thus obtained may be formed into one sheet having a thickness within that range by stacking the resin sheets and hot-pressing the stacked sheets at 80 to 100° C.

In the invention, methods for embedding resin layers B in the resin sheet A are not particularly limited so long as the resin layers B are embedded in positions corresponding to the positions of LED elements so as to face the elements. Examples thereof include: a method in which holes are formed beforehand in the resin sheet A in positions corresponding to the positions of the LED elements to be faced and resin layers B are injected into the holes; and a method in which resin layers B are press-bonded to and embedded in the resin sheet A in positions corresponding to the positions of the LED elements to be faced, without forming holes in the sheet A.

With respect to methods for forming holes in the resin sheet A, the size and depth of the holes and the like are not particularly limited so long as LED elements can be embedded in the resin layers B. A conventional method can be used to form holes.

In the invention, each hole for a resin layer B can be formed by using a die having a diameter of 1 to 5 mm and a height of 0.2 to 1 mm to conduct hot pressing at 80 to 120° C. Incidentally, a plurality of holes may be simultaneously formed by using a plurality of such dies.

Young's modulus of the resin sheet A is preferably 1 to 10 GPa, more preferably 2 to 5 GPa, from the standpoint of protecting optical semiconductor elements. The resin sheet A has an adhesion strength of preferably 10 to 1,000 N, more preferably 100 to 500 N. In this specification, Young's modulus and adhesion strength are determined by the methods in the Examples which will be described later. The resin which is used for constituting the resin layers B is not particularly limited so long as it is a resin which is conventionally used in sheets for optical-semiconductor-element encapsulation and has light resistance and heat resistance. The resin may be in any state such as a liquid state, solid state. With respect to the strength and adhesiveness which are possessed by the resin sheet A, the resin constituting the resin layers B is not particularly limited.

Examples of the resin for constituting the resin layers B include silicone resins, thermoplastic polyimides, and heterosiloxanes. Of these, silicone resins and heterosioloxanes are preferred from the standpoint of moldability. Such resins to be used may be commercial ones or may be ones produced separately.

Examples of the silicone resins include gel-state, semi-cured, and cured silicone resins according to the number of crosslinks in polysiloxane. These may be used alone or in combination thereof. Of these, a crosslinked silicone obtained from a gel-state silicone resin is preferred from the standpoint of moldability.

Examples of the heterosiloxanes include a borosiloxane, aluminosiloxane, phosphasiloxane, titanosiloxane, and the like which are obtained by partly replacing the silicon atoms of a silicone resin with atoms of boron, aluminum, phosphorus, titanium, or the like, respectively.

The resin for constituting the resin layers B has a softening point of preferably 100 to 200° C., more preferably 130 to 150° C., from the standpoint of moldability. The resin has a glass transition point of preferably −70 to 0° C., more preferably −50 to −10° C., from the standpoint of moldability. In this specification, softening point and glass transition point are measured by the methods in the Examples which will be described later.

In the case where resin layers B are embedded in the resin sheet A by injecting the resin layers B into holes which are formed beforehand in the resin sheet A, the resin for constituting the resin layers B may be injected as it is into the holes.

Alternatively, from the standpoint of whitening, a method may be used in which the resin is mixed with a fluorescent substance so as to result in a fluorescent substance concentration of 10 to 30% by weight to prepare a resin solution and this solution is injected. The temperature at which the resin solution injected is dried cannot be unconditionally determined because it varies depending on the kinds of the resin and solvent. However, the drying temperature is preferably 80 to 160° C., more preferably 90 to 150° C. The thickness of each resin layer B obtained through drying with heating in the sheet for optical-semiconductor-element encapsulation according to the invention is preferably 10 to 500 μm, more preferably 50 to 400 μm, from the standpoint of whitening. The term "thickness of a resin layer in the sheet for optical-semiconductor-element encapsulation" in the invention means a thickness as measured in a section where the resin sheet A and a resin layer B are present.

In the case where resin layers B are press-bonded to and embedded in the resin sheet A without forming holes in the sheet A, the resin layers B each are once molded into a block form and then press-bonded and embedded. Namely, resin layers B each in a block form may be obtained by dissolving the resin in an organic solvent such as dimethylacetamide or methyl isobutyl ketone preferably in such an amount as to result in a concentration of 10 to 40% by weight to produce a resin solution; applying the resin solution to, for example, a release sheet such as polyester film having a silicone-treated surface by a technique such as screen printing to form resin solution blocks of an appropriate size; and then drying the solution blocks at such a temperature that solvent removal is possible without causing a curing reaction. Alternatively, resin layers B each in a block form may be obtained by injecting the resin into molds of a desired size and solidifying the resin. The temperature at which the blocks obtained are dried cannot be unconditionally determined because it varies depending on the kinds of the resin and solvent. However, the drying temperature is preferably 100 to 150° C., more preferably 100 to 130° C. It is desirable from the standpoint of whitening that the thickness of each resin layer B block obtained through drying with heating is preferably 200 to 700 μm, more preferably 400 to 600 μm.

Methods for press-bonding resin layers B to the resin sheet A are not particularly limited. Examples thereof include a method in which the resin sheet A is superposed on the resin layer B blocks and the resultant assemblage is hot-pressed at 80 to 130° C.

The ratio of the thickness of the resin sheet A to that of each resin layer B (resin sheet A/resin layer B) after the press bonding is preferably from 1/4 to 1/10, more preferably from 1/5 to 1/6.

Thus, a sheet for optical-semiconductor-element encapsulation which has both of the property of LED element protection and durability is obtained.

In the process for optical-semiconductor-device production of the invention, the sheet for optical-semiconductor-element encapsulation described above is used to easily encapsulate optical semiconductor elements at once. Specifically, the sheet for optical-semiconductor-element encapsulation is superposed on a substrate having LED elements which are mounted thereon and the sheet is laminated to the substrate with a laminator or the like, whereby an optical semiconductor device can be produced.

The LED elements which are used in the invention are not particularly limited so long as the elements are ones for general use in optical semiconductor devices. Examples thereof include gallium nitride (GaN; refractive index, 2.5), gallium phosphide (GaP; refractive index, 2.9), and gallium arsenide (GaAs; refractive index, 3.5). Of these, GaN is preferred because it emits a blue light and enables the production of an LED which emits a white light through a fluorescent substance.

The substrate on which LED elements are mounted are also not particularly limited. Examples thereof include rigid substrates obtained by forming a copper wiring on a glass-epoxy substrate and flexible substrates obtained by forming a copper wiring on a polyimide film. A substrate having a suitable shape such as a flat plate or rugged plate can be used.

Examples of methods for mounting LED elements on the substrate include the face-up mounting method, which is suitable for the mounting of LED elements having electrodes on the light-emitting side, and the flip chip mounting method, which is suitable for the mounting of LED elements having electrodes on the side opposite to the light-emitting side.

In the case where the sheet for optical-semiconductor-element encapsulation according to the invention is melted and laminated to the substrate by press bonding with heating using a laminator or the like, it is preferred to heat the sheet at preferably 70 to 250° C., more preferably 100 to 200° C., and press the sheet at preferably 0.1 to 10 MPa, more preferably 0.5 to 5 MPa.

By the production process of the invention, an optical semiconductor device can be more easily produced because the encapsulation of LED elements can be conducted with the encapsulation sheet at once. Furthermore, since the sheet has the parts thereof which are in contact with the LED elements are excellent in heat resistance and light resistance and the parts thereof which are in contact with the substrate are excellent in adhesiveness and strength, the optical semiconductor device can satisfy both of the property of LED element protection and durability and can have a prolonged life.

EXAMPLES

The present invention will be illustrated in greater detail with reference to the following Examples, but the invention should not be construed as being limited thereto.

Young's Modulus of Resin

A resin which is measured is formed into a strip having a thickness of 100 μm, width of 1 cm, and length of 5 cm and set on a tensile tester (AUTOGRAPH AG-100E, manufactured by Shimadzu Corp.), and this sample having a test length of 1 cm and a width of 1 cm is pulled at a rate of 10 mm/min to obtain a stress-strain chart. An initial modulus is read from the chart and taken as the Young's modulus of the resin.

Adhesion Strength of Resin

A resin which is measured is molded on an Alloy 42 frame into a shape having a size of 7 mm×7 mm and a thickness of 600 μm, and the resultant molded resin is peeled from the Alloy 42 frame by applying a shear-direction force to the molded resin on a 100° C. hot plate. The maximum load required for peeling is taken as the adhesion strength of the resin.

Softening Point of Resin

A resin which is measured is molded on a heating plate so as to have a height of 2 mm. The temperature at which the height of the sample resin has become 1 mm when the heating plate is heated from room temperature is taken as the softening point of the resin.

Glass Transition Point of Resin

A resin which is measured is formed into a strip having a thickness of 100 μm, width of 0.5 cm, and length of 5 cm and examined with DMS (DMS-200, manufactured by SIL). The peak temperature in the resultant tan θ curve is taken as the glass transition point of the resin.

Encapsulation Sheet Production Example 1

45 parts by weight of a bisphenol A epoxy resin having an epoxy equivalent of 7,500 (EP1256, manufactured by Japan Epoxy Resins Co., Ltd.), 33 parts by weight of an alicyclic epoxy resin having an epoxy equivalent of 260 (EHPE3150, manufactured by Daicel Chemical Industries, Ltd.), 22 parts by weight of 4-methylhexahydrophthalic anhydride (MH-700, manufactured by Shin Nihon Rika K.K.), and 1.2 parts by weight of 2-methylimidazole (manufactured by Shikoku Chemicals Corp.) were dissolved in methyl ethyl ketone so as to result in a concentration of 50% by weight. Thus, a coating resin solution was prepared.

The coating resin solution obtained was applied to a biaxially stretched polyester film (thickness, 50 μm; manufactured by Mitsubishi Polyester Corp.) so as to result in a thickness of 100 μm and dried at 130° C. for 2 minutes to obtain one base sheet (30 cm×10 cm). Further, three base sheets were produced in the same manner. The four base sheets in total were laminated with heating at 100° C. to obtain a 400 μm-thick resin sheet A including an epoxy resin as a first layer.

Each of predetermined areas in the resin sheet A was hot-pressed at 100° C. for 10 seconds by using a die having a diameter of 5 mm and a height of 300 μm to form a plurality of holes each having a diameter of 5 mm and a depth of 300 μm in the resin sheet A. An uncrosslinked silicone gel (KE1052, manufactured by Shin-Etsu Silicone) was injected as a second layer into the holes, and this sheet was allowed to stand at 90° C. for 1 hour to obtain an integrated encapsulation sheet A. Properties of the obtained sheet are shown in Table 1.

Encapsulation Sheet Production Example 2

An integrated encapsulation sheet B was obtained in the same manner as in Encapsulation Sheet Production Example 1, except that a silicone varnish prepared by mixing a fluorescent nitride (Sialon) with an uncrosslinked silicone gel (KE1052, manufactured by Shin-Etsu Silicone) so as to result in a concentration of 20% by weight was injected in place of the uncrosslinked silicone gel used for forming the second layer. Properties of the obtained sheet are shown in Table 1.

Encapsulation Sheet Production Example 3

A resin sheet A including an epoxy resin was obtained as a first layer in the same manner as in Encapsulation Sheet Production Example 1. On the other hand, a borosiloxane varnish prepared by dissolving a borosiloxane (manufactured by Nitto Denko Corp.) in methyl isobutyl ketone so as to result in a concentration of 20% by weight was dropped onto a biaxially stretched polyester film (thickness, 50 μm; manufactured by Mitsubishi Polyester Corp.) to thereby apply the varnish in the form of spots having a diameter of 5 mm and a height of 2 mm. The applied varnish was dried at 100° C. for 1 hour and then at 160° C. for 5 hours to form resin layers B including the borosiloxane as a second layer. Thereafter, the resin sheet A was superposed on the resin layers B and the resultant assemblage was hot-pressed at 100° C. for 10 seconds. Thus, an integrated encapsulation sheet C was obtained in which the resin sheet A was press-bonded to the resin layers B. Properties of the obtained sheet are shown in Table 1.

Encapsulation Sheet Production Example 4

An integrated encapsulation sheet D was obtained in the same manner as in Encapsulation Sheet Production Example 3, except that a fluorescent-substance-containing borosiloxane varnish prepared by further incorporating a fluorescent nitride (Sialon) into the borosiloxane varnish so as to result in a concentration of 20% by weight was used for forming a second layer. Properties of the obtained sheet are shown in Table 1.

Encapsulation Sheet Production Example 5

A methacrylic resin (PMMA) film (30 cm×10 cm×600 μm (thickness);
Clarex, manufactured by Nitto Jushi Kogyo) were hot-pressed at 250° C. for 120 seconds by using a die having a diameter of 5 mm and a height of 300 μm to form a plurality of holes each having a diameter of 5 mm and a depth of 300 μm in the first layer. An uncrosslinked silicone gel (KE1052, manufactured by Shin-Etsu Silicone) was injected as a second layer into these holes, and this sheet was allowed to stand at 90° C. for 1 hour to obtain an integrated encapsulation sheet E. Properties of the obtained sheet are shown in Table 1.

Encapsulation Sheet Production Example 6

A resin sheet A including an epoxy resin (thickness, 100 μm) was obtained as a base sheet, i.e., a first layer, in the same manner as in Encapsulation Sheet Production Example 1. On the other hand, an uncrosslinked silicone gel (KE1052, manufactured by Shin-Etsu Silicone) was injected into a mold having dimensions of 30 cm×10 cm×300 μm (depth), allowed to stand at 90° C. for 1 hour, and then taken out to obtain a resin layer B (30 cm×10 cm) having a thickness of 300 μm as a second layer. The resin sheet A and resin layer B obtained were stacked and hot-pressed at 100° C. for 10 seconds to obtain an integrated encapsulation sheet F in which the resin sheet A was press-bonded to the resin layer B. Properties of the sheet obtained are shown in Table 1.

Encapsulation Sheet Production Example 7

A resin sheet A including an epoxy resin (thickness, 100 μm) was obtained as a base sheet, i.e., a first layer, in the same manner as in Encapsulation Sheet Production Example 1. On the other hand, a melted borosilxoane (manufactured by Nitto Denko Corp.) was injected at 150° C. into a mold having dimensions of 30 cm×10 cm×300 μm (depth), cooled to ordinary temperature, and then taken out to obtain a resin layer B (30 cm×10 cm) having a thickness of 300 μm as a second layer. The resin sheet A and resin layer B obtained were stacked and hot-pressed at 100° C. for 10 seconds to obtain an integrated encapsulation sheet G in which the resin sheet A was press-bonded to the resin layer B. Properties of the sheet obtained are shown in Table 1.

Encapsulation Sheet Production Example 8

A sheet consisting only of the resin sheet A used in Encapsulation Sheet Production Example 1 was examined as an encapsulation sheet H. Properties of this sheet are shown in Table 1.

TABLE 1

| | | Integrated encapsulation sheet A | Integrated encapsulation sheet B | Integrated encapsulation sheet C | Integrated encapsulation sheet D | Integrated encapsulation sheet E | Integrated encapsulation sheet F | Integrated encapsulation sheet G | Encapsulation sheet H |
|---|---|---|---|---|---|---|---|---|---|
| Sheet constitution | First layer | epoxy resin | epoxy resin | epoxy resin | epoxy resin | acrylic resin | epoxy resin | epoxy resin | epoxy resin |
| | Second layer | silicone resin | silicone resin | borosiloxane resin | borosiloxane resin | silicone resin | silicone resin | borosiloxane resin | — |
| | Fluorescent substance in second layer | absent | present | absent | present | absent | absent | absent | absent |
| Properties of first layer | Young's modulus (GPa) | 3.2 | 3.2 | 3.2 | 3.2 | 4.8 | 3.2 | 3.2 | 3.2 |
| | Adhesiveness (N) | 118 | 118 | 118 | 118 | 88.3 | 118 | 118 | 118 |
| Properties of second layer | Softening point[1] (° C.) | — | — | 135 | 135 | — | — | 135 | 100 |
| | Glass transition point (° C.) | −20 | −20 | — | — | −20 | −20 | — | — |

[1]In the sheet having no second layer, the softening point of first layer was measured Examples 1 to 5 and Comparative Examples 1 to 4

Subsequently, the obtained encapsulation sheets were used to produce optical semiconductor devices. Namely, each encapsulation sheet shown in Table 2 was superposed on a substrate (glass-epoxy plate) having the LED elements shown in Table 2 mounted thereon, in such a manner that the second layer came into contact with the LED elements. The encapsulation sheet was press-bonded to the substrate at the temperature shown in Table 2 (at 0.5 MPa) and then post-cured at 150° C. for 2 hours. Thus, optical semiconductor devices of Examples 1 to 5 and Comparative Examples 1 to 4 were obtained. In the case of using the encapsulation sheet having no second layer, this encapsulation sheet was directly superposed on the substrate to produce the device.

Properties of each obtained LED device were examined by the methods shown in the following Test Examples 1 to 3. The results obtained are shown in Table 2.

Test Example 1

Durability

A current of 100 mA was caused to flow through each of the LED devices of the Examples and Comparative Examples, and the luminance of the device immediately after initiation of the test was measured with a spectrophotometer (MCPD-3700, manufactured by Otsuka Electronics Co., Ltd.). The integral of luminous intensities in the wavelength range of 380 to 780 nm was calculated. Thereafter, the device was allowed to stand in the state in which the current was flowing therethrough. After 300-hour standing, this device was examined for luminance in the same manner, and the attenuation rate was calculated using the following equation to evaluate durability. The devices having an attenuation rate of 30% or lower were judged to have satisfactory durability.

Attenuation rate (%)=[(luminance immediately after test initiation)−(luminance after lapse of 300 hours)]/(luminance immediately after test initiation)×100

Test Example 2

Adhesiveness

Each of the LED devices of the Examples and Comparative Examples was fixed to a 25° C. or 150° C. hot plate. After the lapse of 1 minute, a load of 1 kg was imposed on the device from a shear direction for the device to examine the device as to whether separation between the substrate and the encapsulation sheet occurred or not. The devices which suffered no separation after fixing at 25° C. and after fixing at 150° C. are indicated by "A", those which suffered no separation after fixing at 25° C. but suffered separation after fixing at 150° C. are indicated by "B", and those which suffered separation after fixing at 25° C. and after fixing at 150° C. are indicated by "C".

Test Example 3

Strength

Each of the LED devices of the Examples and Comparative Examples was disposed on a 120° C. hot plate, and a needle (wire) having a diameter of 1 mm was pushed under a load of 100 g against the device from above the device for 5 minutes to examine the degree of needle penetration. The devices in which the needle depression was smaller than 0.5 mm are indicated by "A", and those in which the needle depression was 0.5 mm or more are indicated by "B".

TABLE 2

|  |  | Example 1 | Example 2 | Example 3 | Example 4 | Example 5 |
|---|---|---|---|---|---|---|
| Encapsulation sheet | | Integrated encapsulation sheet A | Integrated encapsulation sheet B | Integrated encapsulation sheet C | Integrated encapsulation sheet D | Integrated encapsulation sheet E |
| Encapsulation temperature (° C.) | | 150 | 150 | 150 | 150 | 200 |
| LED element | | blue LED | white LED | blue LED | white LED | blue LED |
| Properties of device | Initial luminance (au) | 500 | 410 | 480 | 390 | 500 |
| | Luminance after lapse of time (au) | 420 | 380 | 400 | 370 | 450 |
| | Attenuation rate (%) | 16 | 7 | 17 | 5 | 10 |
| | Adhesiveness | A | A | A | A | B |
| | Strength | A | A | A | A | A |

|  |  | Comparative Example 1 | Comparative Example 2 | Comparative Example 3 | Comparative Example 4 |
|---|---|---|---|---|---|
| Encapsulation sheet | | Integrated encapsulation sheet F | Integrated encapsulation sheet G | Encapsulation sheet H | Encapsulation sheet H |
| Encapsulation temperature (° C.) | | 150 | 150 | 150 | 150 |
| LED element | | blue LED | blue LED | blue LED | white LED |
| Properties of device | Initial luminance (au) | 490 | 510 | 490 | 395 |
| | Luminance after lapse of time (au) | 470 | 470 | 180 | 170 |
| | Attenuation rate (%) | 4 | 8 | 63 | 57 |
| | Adhesiveness | C | C | A | A |
| | Strength | A | A | A | A |

The results given above show that the LED devices of the Examples have lower attenuation rate and better light resistance than the LED devices of the Comparative Examples and further have satisfactory adhesiveness and satisfactory strength. Therefore it can be seen that the LED devices of the Examples are excellent in LED element protection and durability.

The optical semiconductor device obtained by the process of the invention is excellent in LED element protection and durability. Therefore, the device is suitable for use in, e.g., backlights for liquid-crystal panels, traffic signals, large outdoor displays, outdoor advertising signboards, etc.

The invention was detailed with reference specified embodiments. However, it is obvious to a person skilled in the art that the invention may be variously modified and corrected without deviating from the spirit of the invention.

This application is based on Japanese Patent Application No. 2007-228002 filed on Sep. 3, 2007 and an entirety thereof is incorporated herein by reference.

Furthermore, all references cited here are incorporated by reference.

What is claimed is:

1. A process for producing an optical semiconductor device, said process comprising:

disposing a sheet for optical-semiconductor-element encapsulation comprising a resin sheet A and a plurality of resin layers B discontinuously embedded in the resin sheet A and a plurality of optical semiconductor elements mounted on a substrate in such a way that each of said plurality of optical semiconductor elements faces either one of said plurality of resin layers B; and followed by embedding each of said plurality of optical semiconductor elements in either one of said plurality of resin layers B.

2. The process according to claim 1, wherein said plurality of resin layers B comprise a silicone resin or a heterosiloxane.

3. The process according to claim 1, wherein the resin sheet A comprises an epoxy resin or an acrylic resin.

4. A sheet for optical-semiconductor-element encapsulation which is used in the process according to claim 1.

5. The process according to claim 2, wherein the silicone resin is a crosslinked silicone.

6. The sheet according to claim 4, wherein said plurality of resin layers B comprise a silicone resin or a heterosiloxane.

7. The sheet according to claim 4, wherein the resin sheet A comprises an epoxy resin or an acrylic resin.

8. The sheet according to claim 6, wherein the silicone resin is a crosslinked silicone.

* * * * *